(12) United States Patent
Huang

(10) Patent No.: US 12,543,350 B2
(45) Date of Patent: Feb. 3, 2026

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Jinrong Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 550 days.

(21) Appl. No.: 18/150,191

(22) Filed: Jan. 4, 2023

(65) Prior Publication Data

US 2023/0231039 A1 Jul. 20, 2023

(30) Foreign Application Priority Data

Jan. 14, 2022 (CN) .......................... 202210041574.8

(51) Int. Cl.
*H10D 48/36* (2025.01)
*H10B 20/25* (2023.01)
*H10D 48/32* (2025.01)
*H10D 64/01* (2025.01)
*H10D 84/83* (2025.01)

(52) U.S. Cl.
CPC ........... *H10D 48/366* (2025.01); *H10B 20/25* (2023.02); *H10D 64/01* (2025.01); *H10D 84/83* (2025.01)

(58) Field of Classification Search
CPC ...... H10D 48/366; H10D 64/01; H10D 84/83; H10D 84/40; H10B 20/25; H10B 63/10; H10N 70/231; G11C 17/16; H01L 23/5252; H01L 23/481; H01L 21/76895
See application file for complete search history.

(56) References Cited

U.S. PATENT DOCUMENTS

| 5,976,908 | A | * | 11/1999 | Kwon | ................... | H10F 39/151 |
| | | | | | | 257/E27.152 |
| 2016/0013292 | A1 | * | 1/2016 | Choi | ................. | H10D 30/6735 |
| | | | | | | 257/329 |
| 2018/0053767 | A1 | * | 2/2018 | Cheng | ................. | H10D 84/016 |
| 2019/0165044 | A1 | * | 5/2019 | Takaki | .................. | H10B 63/84 |
| 2022/0059674 | A1 | * | 2/2022 | Huang | ................. | H10D 64/671 |

FOREIGN PATENT DOCUMENTS

CN 112447731 A 3/2021

* cited by examiner

*Primary Examiner* — S M Sohel Imtiaz
(74) *Attorney, Agent, or Firm* — Kilpatrick Townsend & Stockton LLP

(57) ABSTRACT

Embodiments disclose a semiconductor structure and a method for fabricating the same. The semiconductor structure includes: a substrate, a gate dielectric layer, a first conductive layer, and a conductive plug. The gate dielectric layer is provided on the substrate, and the first conductive layer is provided on the gate dielectric layer. The conductive plug is provided on the gate dielectric layer and covers a side wall of the first conductive layer, where a projection of the conductive plug on the substrate and a projection of the gate dielectric layer on the substrate at least partially overlap. By providing the conductive plug, a breakdown current can break down a region of the gate dielectric layer corresponding to the conductive plug by means of the conductive plug. That is, a breakdown position is adjusted by controlling an overlapping position between the conductive plug and the gate dielectric layer.

16 Claims, 12 Drawing Sheets

SEMICONDUCTOR STRUCTURE AND METHOD FOR FABRICATING SAME

CROSS-REFERENCE TO RELATED APPLICATION

This application claims priority to Chinese Patent Application No. 202210041574.8, titled "SEMICONDUCTOR STRUCTURE AND METHOD FOR FABRICATING SAME" and filed to the State Patent Intellectual Property Office on Jan. 14, 2022, the entire contents of which are incorporated herein by reference.

TECHNICAL FIELD

Embodiments of the present disclosure relate to the field of semiconductor technology, and more particularly, to a semiconductor structure and a method for fabricating the same.

BACKGROUND

As a very important programmable interconnection unit, an anti-fuse is not conductive when being not activated, but becomes a conductor after being activated to form an electrical connection. Two devices or chips that are originally electrically isolated are selectively allowed to be electrically connected, and different resistance values for logic operations can be provided.

In related technologies, the anti-fuse may be programmed by means of electrical breakdown. However, a breakdown position of the anti-fuse is random in the related technologies, which adversely affects consistency in programming.

SUMMARY

Embodiments of the present disclosure provide a semiconductor structure and a method for fabricating the same.

The semiconductor structure in the embodiments of the present disclosure includes: a substrate, a gate dielectric layer, a first conductive layer, and a conductive plug. The gate dielectric layer is provided on the substrate, and the first conductive layer is provided on the gate dielectric layer. The conductive plug is provided on the gate dielectric layer and covers a side wall of the first conductive layer, where a projection of the conductive plug on the substrate and a projection of the gate dielectric layer on the substrate at least partially overlap.

A method for fabricating a semiconductor structure according to the embodiments of the present disclosure includes: providing a substrate; sequentially forming a gate dielectric layer and a first conductive layer on the substrate from bottom to top; and forming a conductive plug on a side wall of the first conductive layer, where a projection of the conductive plug on the substrate and a projection of the gate dielectric layer on the substrate at least partially overlap.

Figure 1:
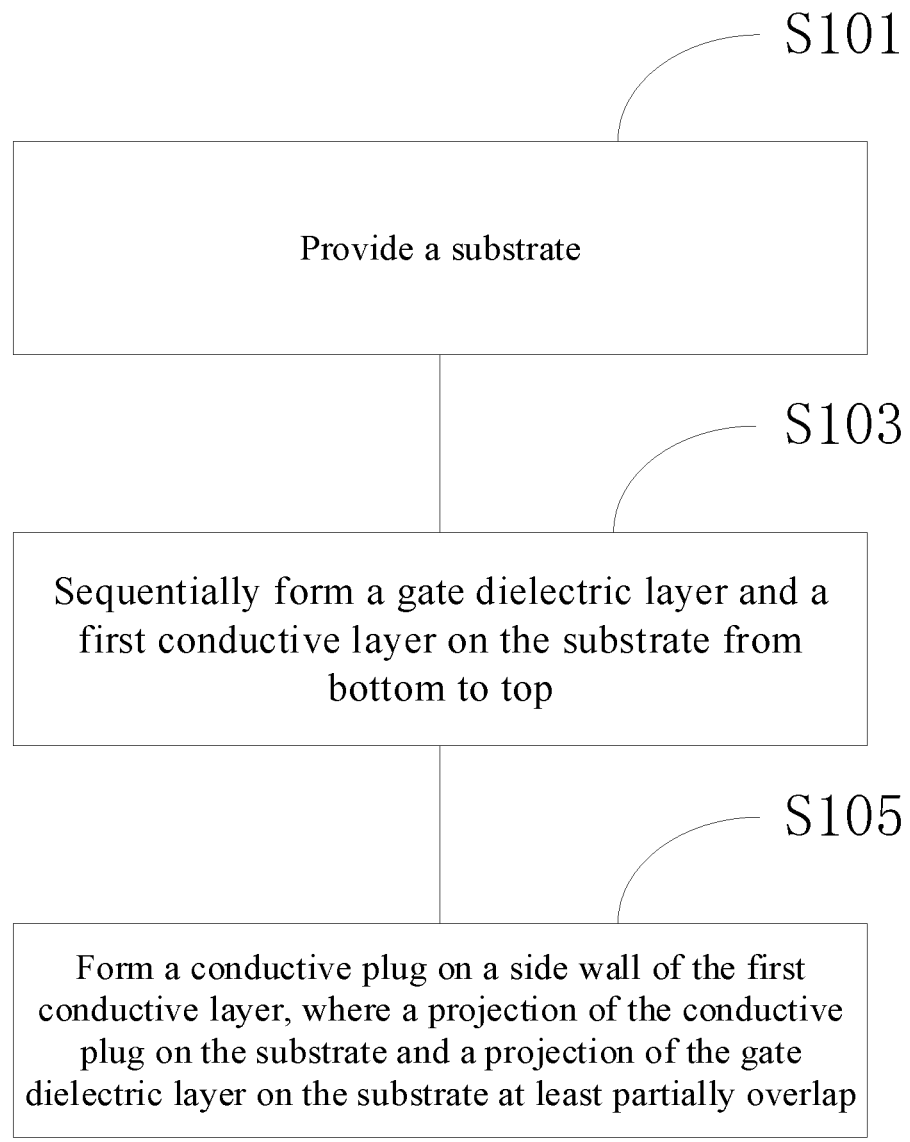
FIG. 1 illustrates a flow diagram of a method for fabricating a semiconductor structure according to an embodiment of the present disclosure.

Reference numerals in the accompanying drawings:
10—gate structure;
20—anti-fuse structure;
100—substrate;
110—source structure;
111—first N-type lightly doped drain region;
112—N+ source region;
120—drain structure;
121—second N-type lightly doped drain region;
122—N+ drain region;
200—gate dielectric layer;
300—first conductive layer;
400—conductive plug;
500—inducing layer;
610—sacrificial wall;
611—first spacer;
612—sacrificial wall retained;
620—second spacer;
700—barrier layer;
800—second conductive layer;
910—gap; and
920—bit line.

DETAILED DESCRIPTION

Exemplary embodiments will now be described more comprehensively with reference to the accompanying drawings. However, exemplary embodiments can be implemented in many forms. It shall not be understood that the present disclosure is limited to embodiments as set forth herein; instead, these embodiments are provided to ensure the present disclosure to be more comprehensive and complete. And the conception of these exemplary embodiments shall be conveyed to those skilled in the art across-the-board. Throughout the drawings, similar reference signs indicate the same or similar structures, and thus their detailed description will be omitted.

As shown in FIG. 1, FIG. 1 illustrates a flow diagram of a method for fabricating a semiconductor structure according to an embodiment of the present disclosure. The method for fabricating the semiconductor structure according to the embodiment of the present disclosure includes: Step S101: providing a substrate; Step S103: sequentially forming a gate dielectric layer and a first conductive layer on the substrate from bottom to top; and Step S105: forming a conductive plug on a side wall of the first conductive layer, where a projection of the conductive plug on the substrate and a projection of the gate dielectric layer on the substrate at least partially overlap.

Based on a design where the conductive plug is arranged on the side wall of the first conductive layer and a projection of the conductive plug on the substrate and a projection of the gate dielectric layer on the substrate at least partially overlap, a breakdown current can break down a region of the gate dielectric layer corresponding to the conductive plug by means of the conductive plug. That is, a breakdown position is adjusted by controlling an overlapping position between the conductive plug and the gate dielectric layer, to achieve an effect of centralized breakdown position, thereby ensuring consistency in programming.

The method for fabricating the semiconductor structure according to the embodiment of the present disclosure is described in detail below with reference to FIG. 2 to FIG. 11. It should be noted that, FIG. 1 shows the method for fabricating the semiconductor structure. The steps of the method are described in conjunction with FIG. 2 to FIG. 11, which show partial sectional views of workpieces for performing the method. The method is only an example, and is not limited to the actual description of the method in the embodiments of the present disclosure. It is to be understood that additional steps are provided before, during, and after the method, and that additional embodiments of the method may replace, omit, or interchange some of these steps. All the steps are not detailed herein to simplify the description.

Figure 2:
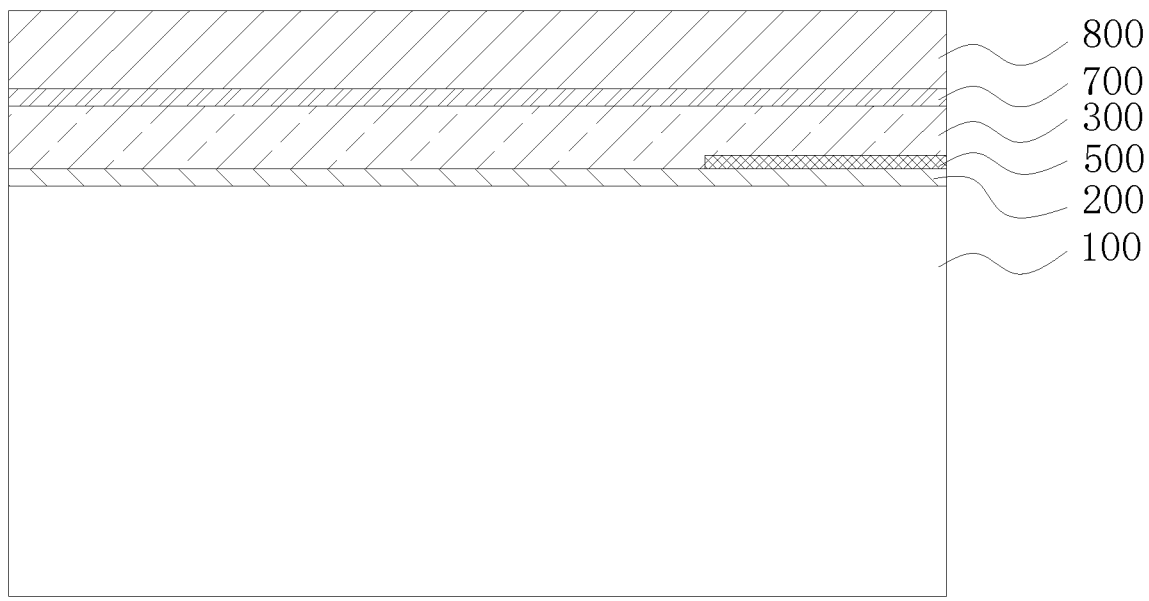
FIGS. 2 to 11 illustrate schematic structural diagrams of a processes of forming the semiconductor structure according to an embodiment of the present disclosure.

As shown in FIG. 2 a substrate 100 is provided, and a gate dielectric layer 200, a first conductive layer 300, a barrier layer 700 and a second conductive layer 800 are sequentially formed on the substrate 100 from bottom to top.

It is to be understood that in the embodiments of the present disclosure, terms "first" and "second" are merely for description purposes, and are not construed as indicating or implying relative importance.

A material of the substrate 100 may be silicon (Si), germanium (Ge), silicon germanium (GeSi), silicon carbide (SiC), silicon-on-insulator (SOI), germanium-on-insulator (GOI), or other materials, e.g., III-V group compounds such as gallium arsenide. In this embodiment, the material of the substrate 100 is silicon.

The substrate 100 may include an active area (not shown in the figure), which may serve as a lower electrode of an anti-fuse. The active area may be doped with impurity ions, and the impurity ions may be P-type impurity ions or N-type impurity ions. For example, the P-type impurity ions may be one or more of boron ions, gallium ions, or indium ions, and the N-type impurity ion may be one or more of phosphorus ions, arsenic ions, or antimony ions.

A shallow trench isolation structure (not shown in the figure) is also formed in the substrate 100, where the shallow trench isolation structure is configured to isolate different active areas and preventing electrical connection between the different active areas.

For example, a material of the shallow trench isolation structure may be one or more of silicon oxide, silicon nitride, and silicon oxynitride.

Processes of forming the shallow trench isolation structure may include: forming a mask layer on the substrate 100, where the mask layer has an opening exposing a surface of the substrate 100; etching the substrate 100 using the mask layer having the opening as a mask, to form a trench in the substrate 100; and filling up the trench with an isolation material to form the shallow trench isolation structure.

It is to be understood that part of the substrate 100 surrounded by the shallow trench isolation structure serves as the active area.

With continued reference to FIG. 2, a material of the gate dielectric layer 200 may be silicon oxide, and processes of forming the gate dielectric layer 200 may include thermal oxidation and deposition processes. Of course, the gate dielectric layer 200 may also include other materials.

A material of the first conductive layer 300 may be polysilicon or metal, where the metal may be one or more of W, Al, Cu, Ti, Ag, Au, Pt, and Ni.

In this embodiment, the material of the first conductive layer 300 is polysilicon.

The barrier layer 700 is provided on the first conductive layer 300 and is provided between the first conductive layer 300 and the second conductive layer 800, to prevent ions in the second conductive layer 800 from diffusing into the first conductive layer 300 and prevent ions in the first conductive layer 300 from diffusing into the second conductive layer 800. A material of the barrier layer 700 may be titanium nitride, but is not limited thereto.

The barrier layer 700 may be formed by means of atomic layer deposition (ALD), such that a thickness of the barrier layer 700 may be guaranteed.

A material of the second conductive layer 800 may be metal, which may be one or more of W, Al, Cu, Ti, Ag, Au, Pt, and Ni.

With continued reference to FIG. 2, after forming the gate dielectric layer 200 on the substrate 100 and before forming the first conductive layer 300, the method for fabricating the semiconductor structure in the embodiment of the present disclosure further includes: forming an inducing layer 500 on the gate dielectric layer 200.

In this embodiment, the inducing layer 500 covers part of the gate dielectric layer 200. In some embodiments, an orthographic projection region of the inducing layer 500 on the substrate 100 corresponds to an anti-fuse structure 20 subsequently formed on the substrate 100.

It is to be understood that, a material of the inducing layer 500 includes a phase change material. Under a stimulation of Joule heat, the inducing layer 500 made of the phase change material may form atomic umbrella jump locally, and then a material in a breakdown region of the inducing layer 500 may be changed from a high-resistance state to a low-resistance state (i.e., an on state). In this way, one local high joule heat region may be generated in the inducing layer 500, such that current is instantaneously turned on in this region, which is advantageous to reducing a breakdown voltage and saving energy consumption.

The phase change material may include one or any combination of antimony telluride ($Sb_xTe_y$), germanium antimony tellurium ($Ge_xSb_yTe_z$), scandium antimony tellurium ($Sc_xSb_yTe_z$), chromium antimony tellurium ($Cr_xSb_yTe_z$), and the like, where x, y, and z represent atomic percentages of elements.

In this embodiment, the material of the inducing layer 500 is $Sb_2Te_3$.

Figure 3:
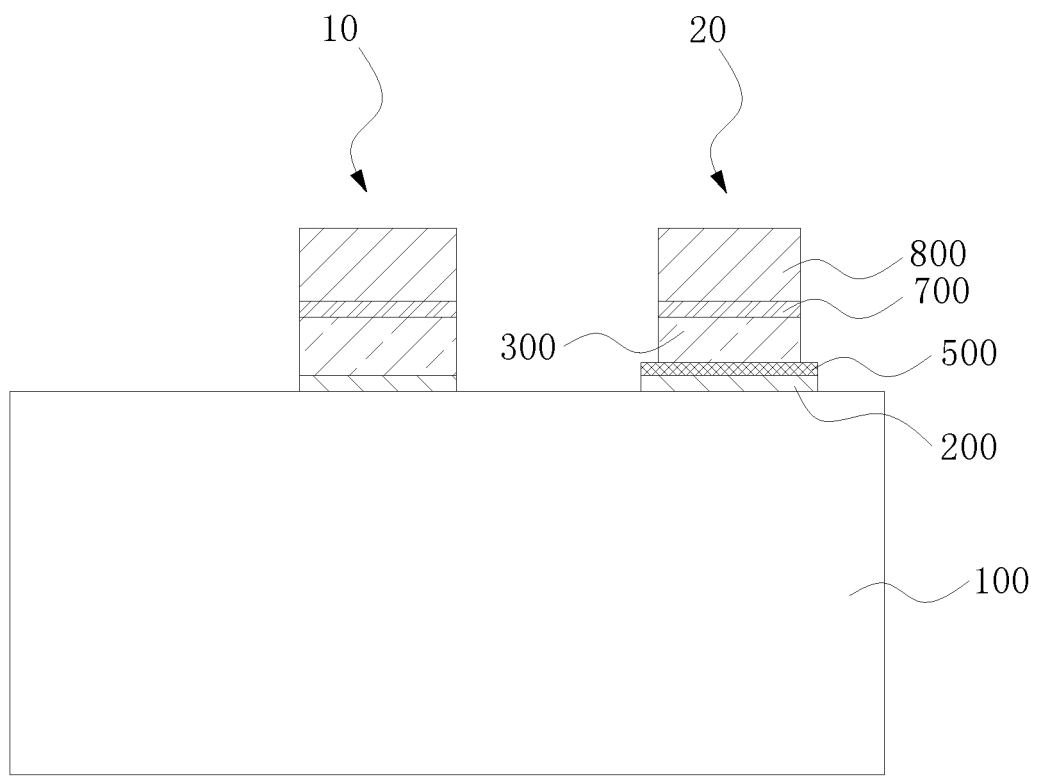

As shown in FIG. 3, a gate structure 10 and the anti-fuse structure 20 are formed on the substrate 100.

Processes of forming the gate structure 10 and the anti-fuse structure 20 may include: forming a photoresist layer on the surface of the second conductive layer 800, and then sequentially performing steps of exposure, development, etching and the like to remove regions other than the gate structure 10 and the anti-fuse structure 20 on the substrate 100.

As an example, a material of the photoresist layer is an antireflection material having negative photoresist characteristics or a negative photoresist. Therefore, a region of the photoresist layer corresponding to a region where the opening is to be formed is exposed, such that the material of the photoresist layer in the exposed region is cross-linked, while the material of the photoresist layer in an unexposed region remains unchanged. The photoresist layer exposed is developed, such that the material cross-linked is insoluble in a developing solution, and the material not cross-linked is dissolved in the developing solution, thereby forming the photoresist layer having the opening.

As another embodiment, the material of the photoresist layer is an antireflection material having positive photoresist characteristics or a positive photoresist, and a region of the photoresist layer other than the region where the opening is to be formed is exposed, such that the material of the photoresist layer in the exposed region is degraded, while the material of the photoresist layer in the unexposed region remains unchanged. The photoresist layer exposed is developed, such that the material degraded is dissolved in the developing solution, while the material not degraded is insoluble in the developing solution, thereby forming the photoresist layer having the opening.

It is to be understood that, the steps of photoresist coating, exposure, development, etching and the like in the processes of forming the gate structure 10 and the anti-fuse structure 20 may employ mature devices and processes in the prior art, which are not described herein again.

With continued reference to FIG. 3 projections of the first conductive layer 300, the barrier layer 700 and the second conductive layer 800 in the anti-fuse structure 20 on the substrate 100 completely overlap. A projection of the gate dielectric layer 200 on the substrate 100 and a projection of the inducing layer 500 on the substrate 100 completely overlap. Meanwhile, the projections of the first conductive layer 300, the barrier layer 700 and the second conductive layer 800 on the substrate 100 fall within the projections of the gate dielectric layer 200 and the inducing layer 500 on the substrate 100. That is, the first conductive layer 300 partially overlaps the inducing layer 500, and an edge of the inducing layer 500 is exposed.

Figure 4:
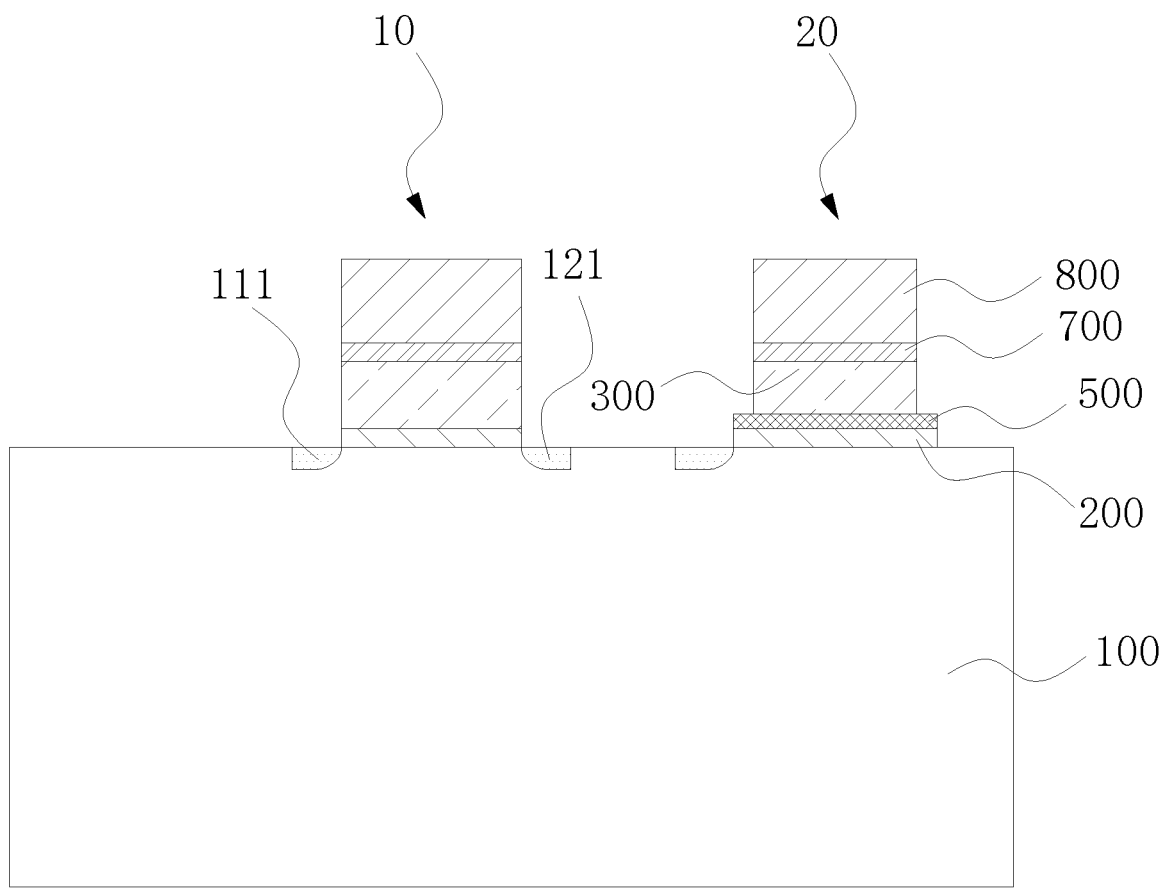
Figure 7:
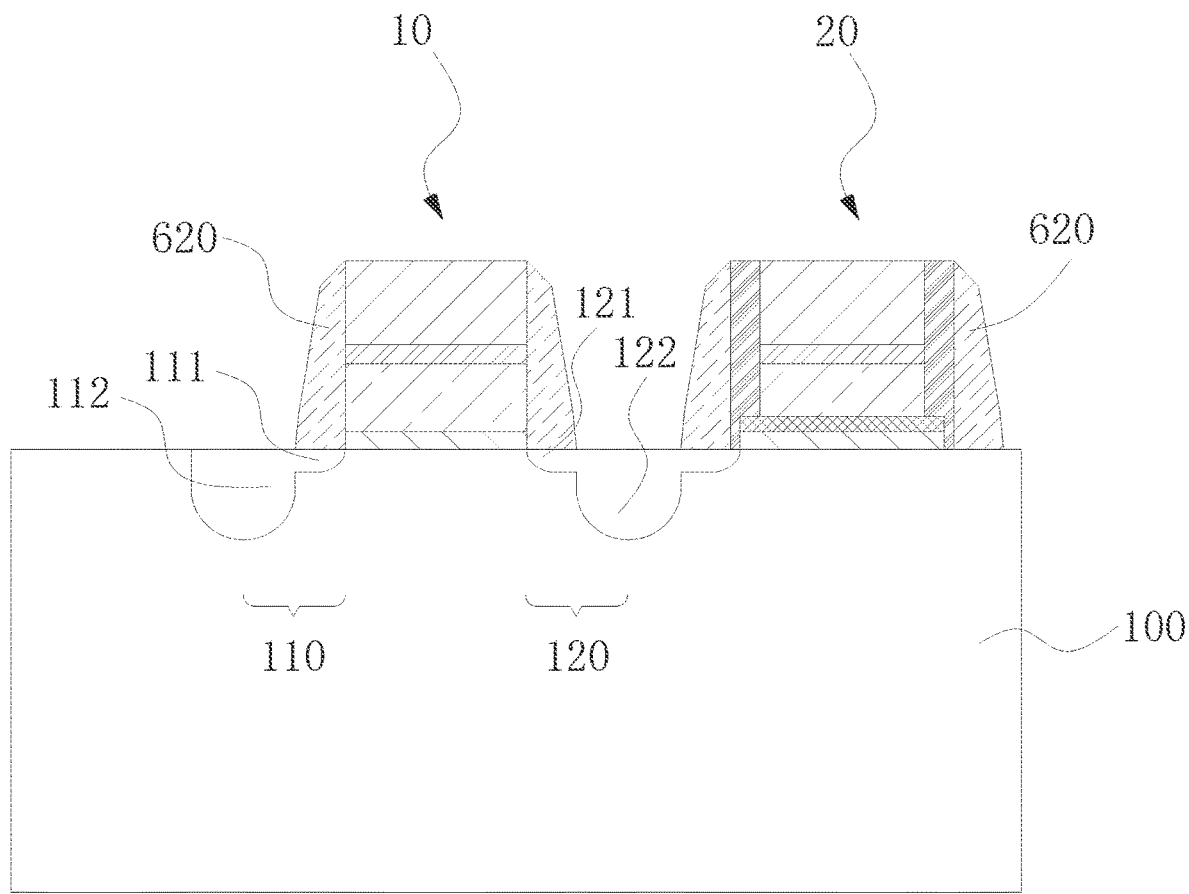

As shown in FIG. 4 and FIG. 7, a source structure 110 and a drain structure 120 are respectively formed on two sides of the gate structure 10, both the source structure 110 and the drain structure 120 are formed in the substrate 100, and the source structure 110 and the drain structure 120 are arranged oppositely.

Figure 6:
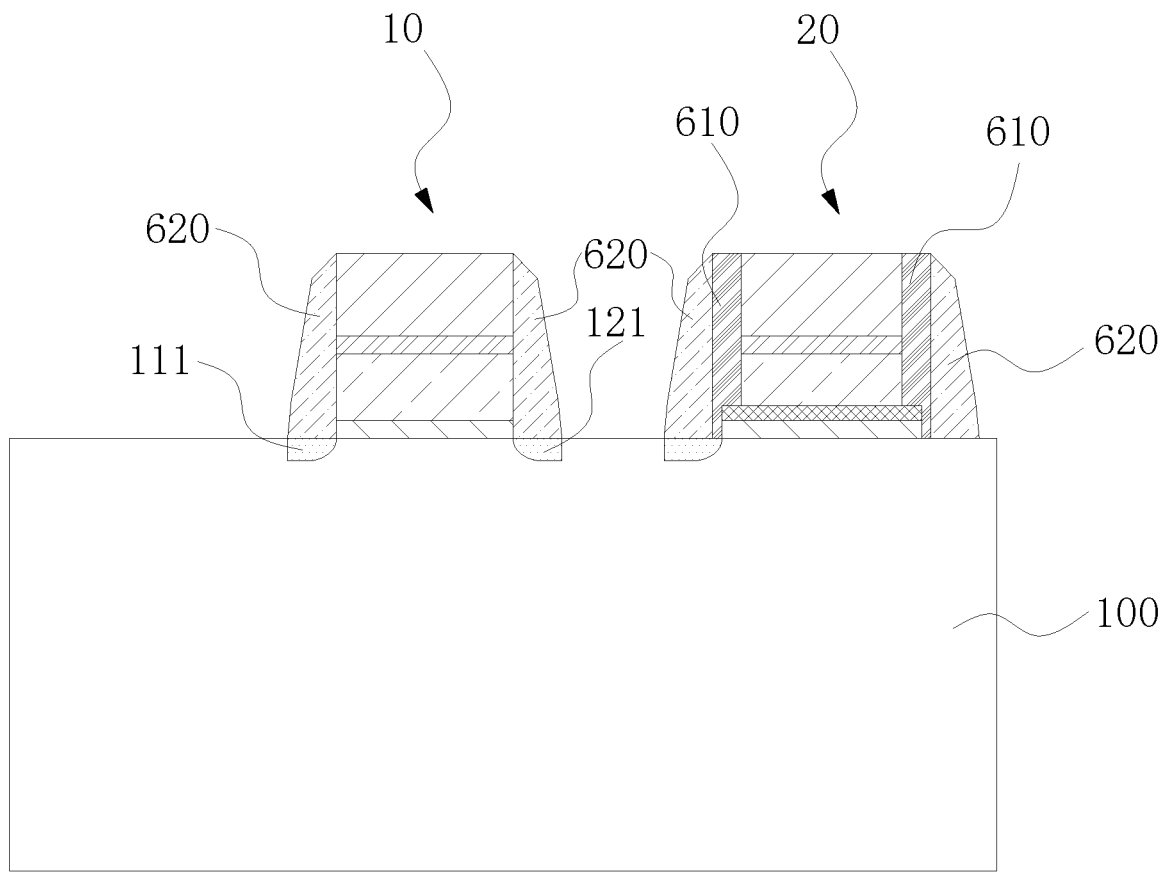

The source structure 110 may include a first N-type lightly doped drain (NLDD) region 111 and an N+ source region 112. The first NLDD region 111 is adjacent to the N+ source region 112, and a second spacer 620 (as shown in FIG. 6) is provided above the first NLDD region 111.

For example, the first NLDD region 111 may be formed by implanting N-type dopants, such as a certain amount of phosphorus and arsenic. The N+ source region 112 may be formed by implanting an N-type dopant, such as a certain amount of arsenic.

The drain structure 120 may include a second NLDD region 121 and an N+ drain region 122. The second NLDD region 121 is adjacent to the N+ drain region 122, and the second spacer 620 (as shown in FIG. 6) is provided above the second NLDD region 121.

For example, the second NLDD region 121 may be formed by implanting an N-type dopant, such as a certain amount of arsenic.

Of course, in other embodiments, the NLDD region and the N+ source region or the like may be replaced by a P-type lightly doped drain (PLDD) region and a P+ source region or the like, respectively.

As shown in FIG. 5 to FIG. 10, a conductive plug 400 is formed on a side wall of the first conductive layer 300, where a projection of the conductive plug 400 on the substrate 100 and the projection of the gate dielectric layer 200 on the substrate 100 at least partially overlap.

The step of forming the conductive plug 400 on the side wall of the first conductive layer 300 includes: forming a sacrificial wall 610 on a side wall of the gate dielectric layer 200, a side wall of the inducing layer 500, a side wall of the first conductive layer 300, a side wall of the barrier layer 700 and a side wall of the second conductive layer 800 respectively, where a bottom surface of the sacrificial wall 610 is in contact with a top surface of the inducing layer 500; forming a second spacer 620 on an outer side wall of the sacrificial wall 610; removing part of the sacrificial wall 610 to form a gap 910 between the second spacer 620 and the first conductive layer 300, the barrier layer 700 and the second conductive layer 800, a bottom of the gap 910 exposing the inducing layer 500, where a remaining part of the sacrificial wall serves as a first spacer 611, and the first spacer 611 is provided on the substrate 100 and covers the side wall of the inducing layer 500 and the side wall of the gate dielectric layer 200; and filling a conductive material in the gap 910 to form the conductive plug 400.

The processes of forming the conductive plug 400 will be described in detail below with reference to FIG. 5 to FIG. 10.

Figure 5:
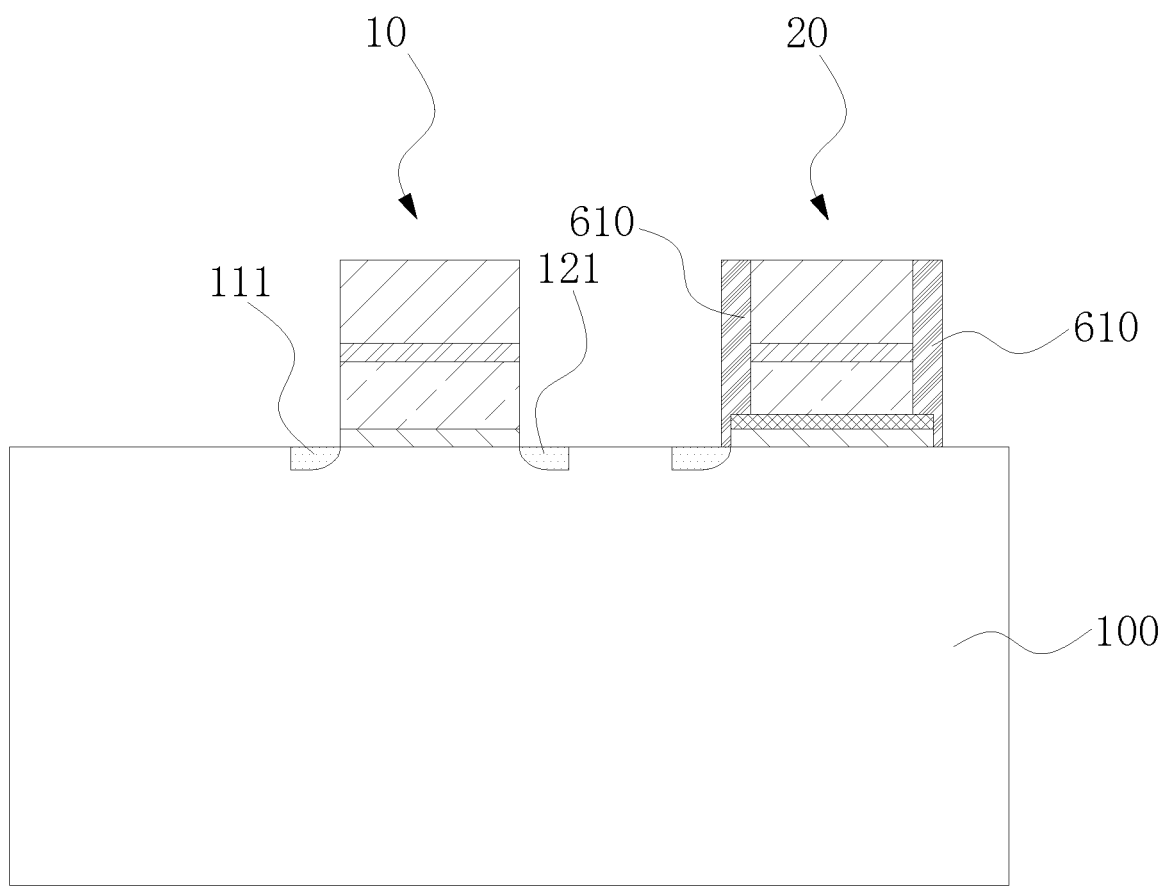

As shown in FIG. 5, the sacrificial wall 610 is formed on the side wall of the anti-fuse structure 20. That is, the sacrificial wall 610 is formed on the side wall of the gate dielectric layer 200, the side wall of the inducing layer 500, the side wall of the first conductive layer 300, the side wall of the barrier layer 700, and the side wall of the second conductive layer 800. The sacrificial wall 610 covers the side wall of the gate dielectric layer 200, of the inducing layer 500, of the first conductive layer 300, of the barrier layer 700, and of the second conductive layer 800, and covers an exposed top surface of the inducing layer 500.

It is to be understood that a material of the sacrificial wall 610 may be silicon oxide, silicon nitride, silicon oxynitride, and the like. In this embodiment, the material of the sacrificial wall 610 is silicon oxide.

As shown in FIG. 6, the second spacer 620 is formed on the outer wall of the sacrificial wall 610 of the anti-fuse structure 20 and on two sides of the gate structure 10. The second spacer 620 may be positioned over the first NLDD region 111 or the second NLDD region 121.

A material of the second spacer 620 may be silicon nitride.

As shown in FIG. 7, ion implantation is performed on the substrate 100 to form the source structure 110 and the drain structure 120.

Figure 8:
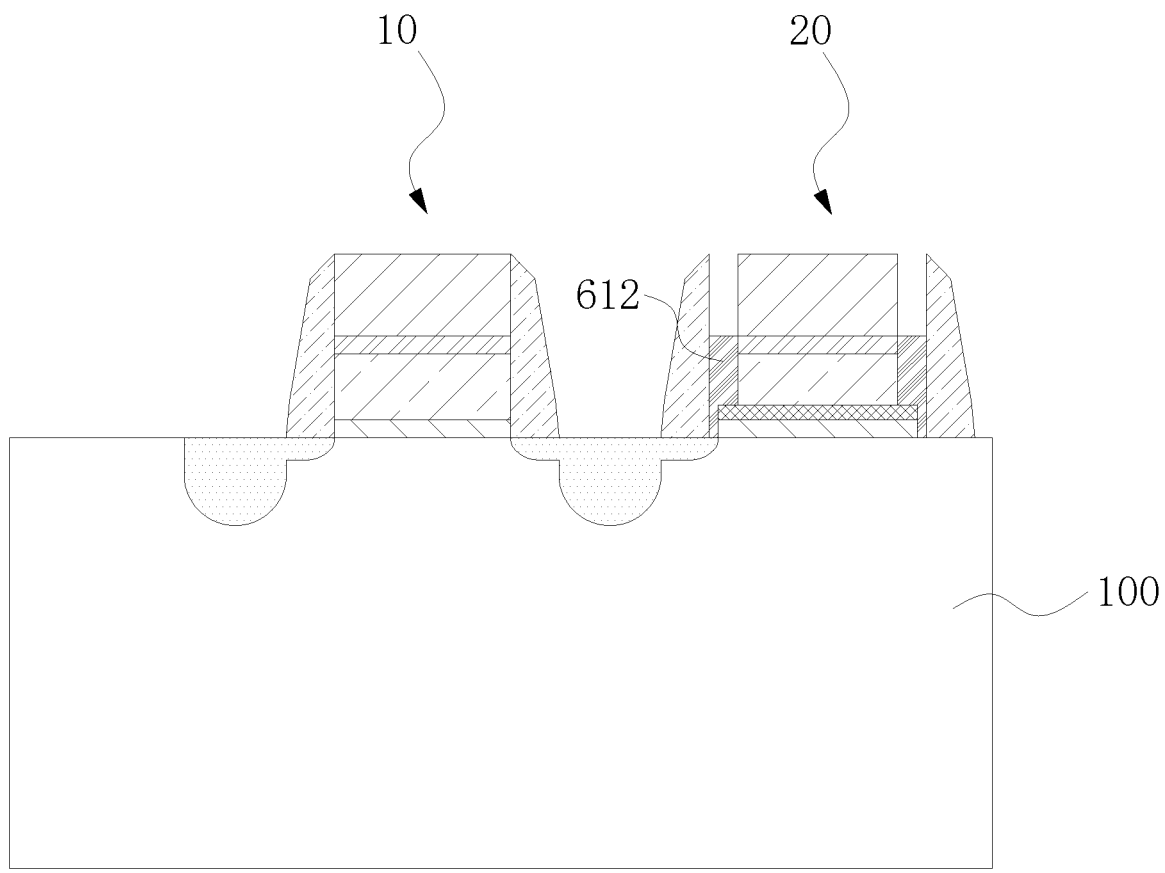
Figure 9:
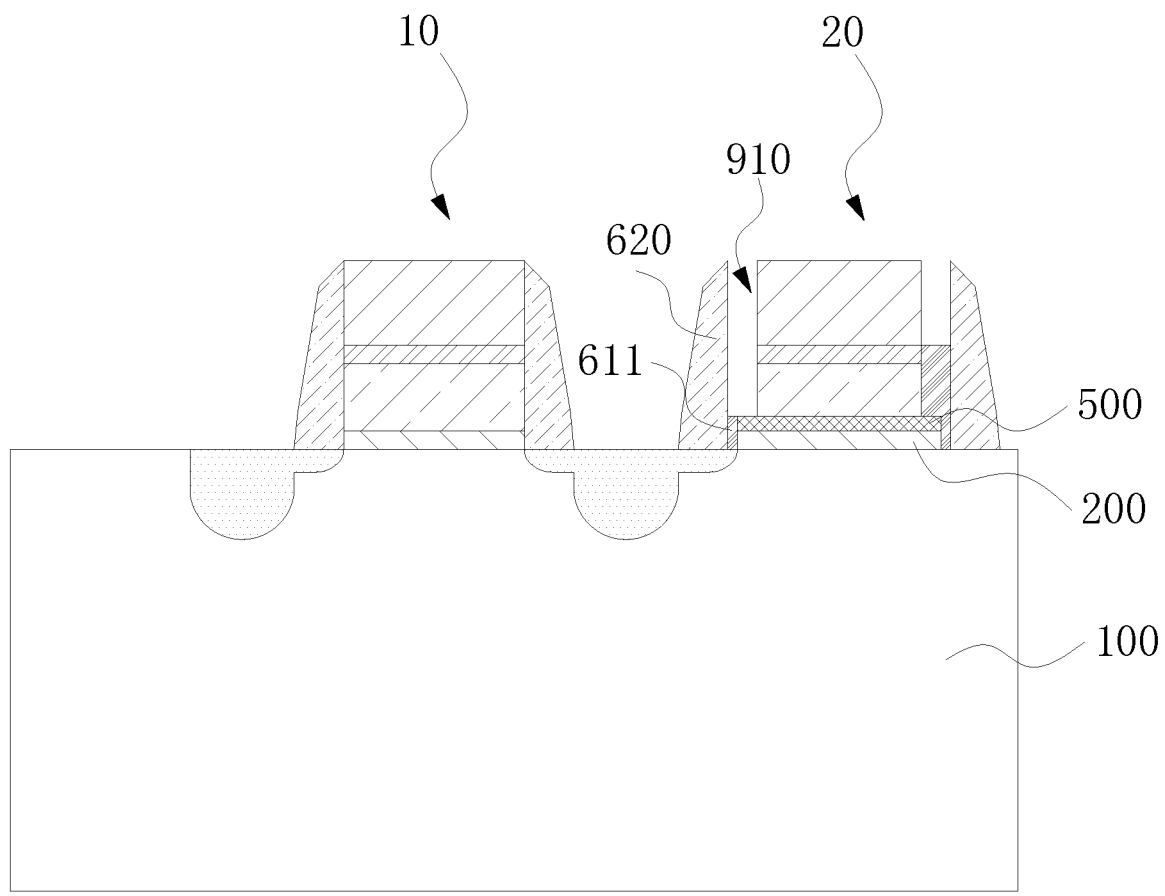

As shown in FIG. 8 and FIG. 9, the removing part of the sacrificial wall 610 to form the gap 910 between the second spacer 620 and the first conductive layer 300, the barrier layer 700 and the second conductive layer 800 includes: removing part of the sacrificial wall 610 by means of wet etching until a top surface of the sacrificial wall 612 retained is flush with a bottom surface of the second conductive layer 800; and removing part of the sacrificial wall 612 retained by means of dry etching until the top surface of the remaining part of the sacrificial wall is flush with a top surface of the inducing layer 500.

As shown in FIG. 8, part of the sacrificial walls 610 on two sides of the anti-fuse structure 20 are removed by means of the wet etching process until the top surfaces of the sacrificial walls 612 retained on two sides are both flush with the bottom surface of the second conductive layer 800.

Of course, it is to be understood that, a stop position after etching the sacrificial wall 610 by means of the wet etching process may also refer to that: the top surface of the sacrificial wall 612 retained is flush with the top surface of the first conductive layer 300; or, the top surface of the sacrificial wall 612 retained is positioned in a middle region of the barrier layer 700 in a thickness direction; or, the top surface of the sacrificial wall 612 retained is positioned in a middle region of the first conductive layer 300 in the thickness direction.

It is to be understood that, a chemical solution such as HF/HNO$_3$ may be used in the wet etching process, but not limited thereto.

As shown in FIG. 9, part of the sacrificial wall 612 retained is removed by means of the dry etching process until the top surface of the remaining sacrificial wall is flush with the top surface of the inducing layer 500. The sacrificial wall retained is positioned on a side of the anti-fuse structure 20 facing the gate structure 10.

It is to be understood that, gases such as $C_4F_6$ and $CH_2F_2$ may be used in the dry etching, but not limited thereto.

It should be noted that, the gap 910 is formed by etching part of the sacrificial wall 610 by means of two etching steps, to protect an outer contour of the second conductive layer 800 by utilizing different etching selectivity between different material layers, thereby preventing morphology of the second conductive layer 800 from being damaged by over-etching.

It is to be understood that the remaining sacrificial wall is the first spacer 611, which is disposed on the substrate 100 and is arranged between the second spacer 620, the inducing layer 500 and the gate dielectric layer 200.

It should be noted that, the retained sacrificial wall 612 positioned on a side of the anti-fuse structure 20 facing away from the gate structure 10 is not etched during the dry etching (i.e., the second etching), and thus the top surface thereof remains to be flush with the bottom surface of the second conductive layer 800.

Figure 10:
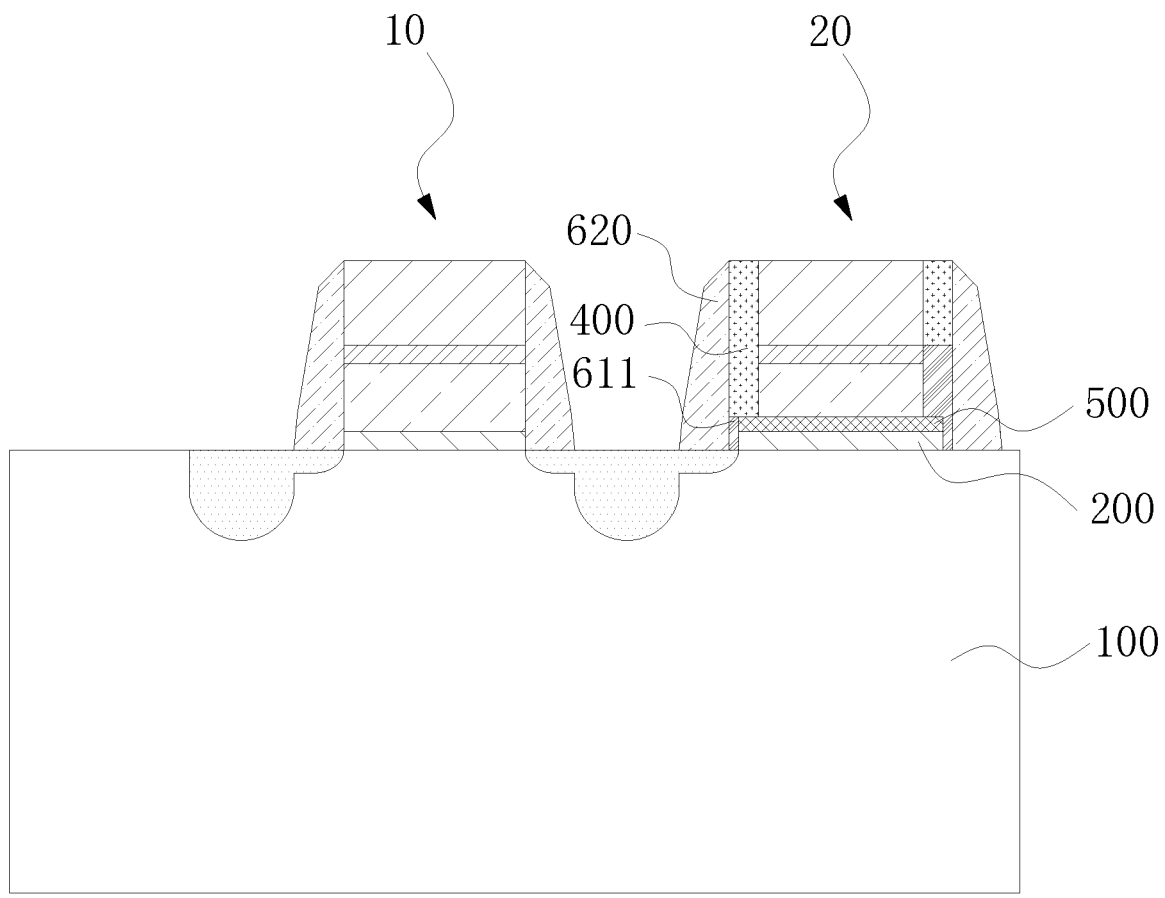

As shown in FIG. 10, a metallic material is filled between the second spacer 620 and the anti-fuse structure 20. The metallic material positioned on a side of the anti-fuse structure 20 facing the gate structure 10 forms the conductive plug 400, and a bottom wall of the conductive plug 400 is in contact with the top surface of the first spacer 611 and part of the top surface of the inducing layer 500.

It is to be understood that the metallic material may be one or more of W, Al, Cu, Ti, Ta, and Co.

In this embodiment, the metallic material is W.

When the anti-fuse structure 20 is programmed, a programming voltage is conducted across the conductive plug 400, and the programming voltage causes the gate dielectric layer 200 to be broken down. Before and after the gate dielectric layer 200 is broken down, a resistance between the first conductive layer 300 and the active area of the substrate 100 is greatly changed. Before the gate dielectric layer 200 is broken down, the resistance between the first conductive layer 300 and the active area is in a high-resistance state. After the gate dielectric layer 200 is broken down, the resistance between the first conductive layer 300 and the active area is in a low-resistance state. Therefore, data "1" or "0" is stored according to a fact whether the gate dielectric layer 200 is broken down or not.

Figure 11:
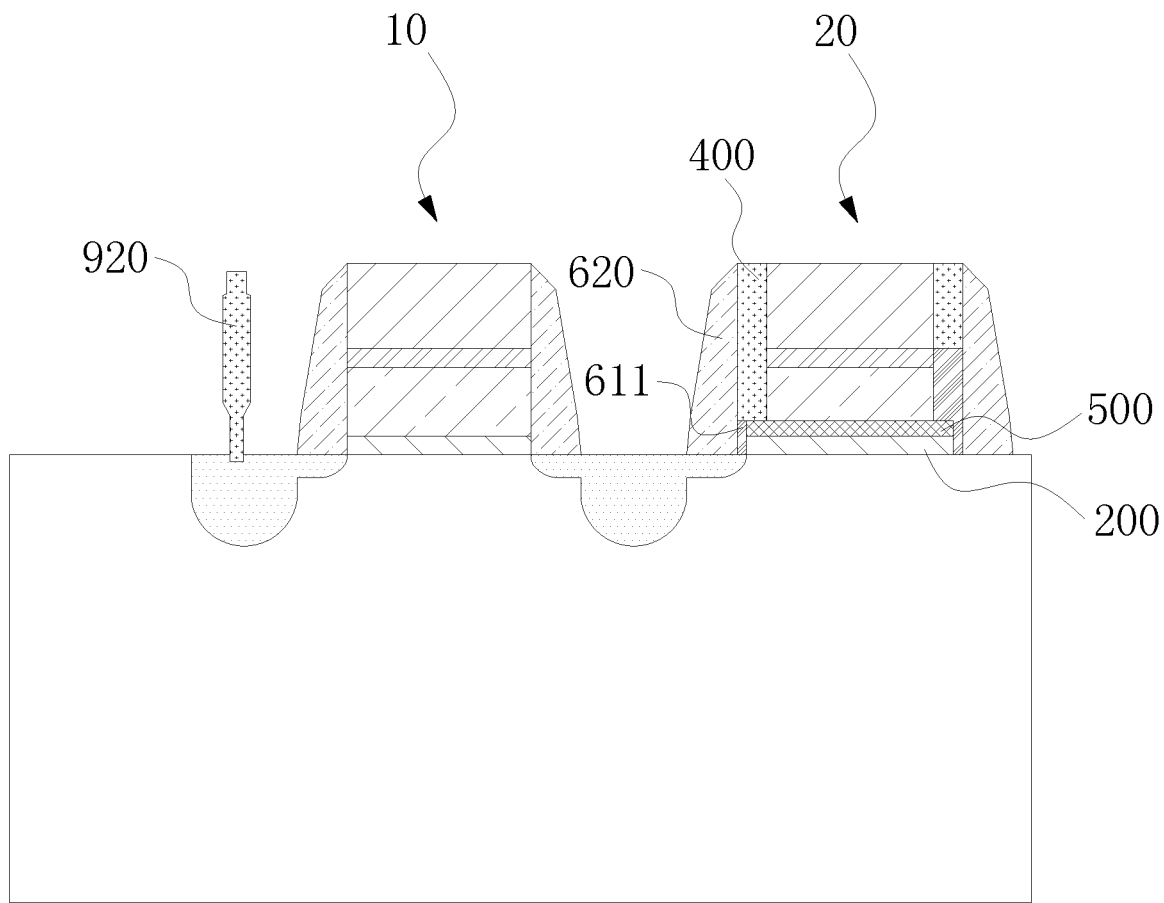

As shown in FIG. 11, a bit line 920 structure, a contact structure (not shown in the figure) or other semiconductor structure is formed on the substrate 100.

With continued reference to FIG. 11, the embodiments of the present disclosure also provide a semiconductor structure, which includes a substrate 100, a gate dielectric layer 200, a first conductive layer 300, a conductive plug 400, and an inducing layer 500. The gate dielectric layer 200 is disposed on the substrate 100, the first conductive layer 300 is arranged on the gate dielectric layer 200, and the conductive plug 400 is disposed on the gate dielectric layer 200 and covers a side wall of the first conductive layer 300. A projection of the conductive plug 400 on the substrate 100 and a projection of the gate dielectric layer 200 on the substrate 100 at least partially overlap, such that the conductive plug 400 can guide a current to break down a region of the gate dielectric layer 200 corresponding to the conductive plug 400. The inducing layer 500 is disposed between the gate dielectric layer 200 and the first conductive layer 300, and a top surface and a bottom surface of the inducing layer 500 are in contact with the conductive plug 400 and the gate dielectric layer 200, respectively, where the inducing layer 500 includes a phase change material.

In the semiconductor structure in the embodiments of the present disclosure, by providing the conductive plug 400, a breakdown current can break down a region of the gate dielectric layer 200 corresponding to the conductive plug 400 by means of the conductive plug 400. That is, a breakdown position is adjusted by controlling an overlapping position between the conductive plug 400 and the gate dielectric layer 200, to achieve an effect of centralized breakdown position, thereby ensuring consistency in programming.

In addition, the bottom surface of the conductive plug 400 is in contact with the top surface of the inducing layer 500, the bottom surface of the inducing layer 500 is in contact with the top surface of the gate dielectric layer 200, and the breakdown current is transmitted into the inducing layer 500 along the conductive plug 400. Because the material of the inducing layer 500 is the phase change material, the phase change material may form the atomic umbrella jump locally under the stimulation of Joule heat generated by the breakdown current, such that the material in the breakdown region of the inducing layer 500 may be changed from the high-resistance state to the low-resistance state (i.e., the on state). One local high Joule heat region is generated in the inducing layer 500, such that the current is instantaneously turned on in the region, and finally the breakdown current breaks down the region in the gate dielectric layer 200 corresponding to the high Joule heat region. Under the combined action of the conductive plug 400 and the inducing layer 500, the breakdown position is more fixed, and the breakdown voltage is smaller, which not only achieves the effect of centralized breakdown position, but also can save the energy consumption.

It is to be understood that the phase change material may include one or any combination of antimony telluride ($Sb_x\text{-}Te_y$), germanium antimony tellurium ($Ge_xSb_yTe_z$), scandium antimony tellurium ($Sc_xSb_yTe_z$), chromium antimony tellurium ($Cr_xSb_yTe_z$), and the like, where x, y, and z represent atomic percentages of elements.

In this embodiment, the material of the inducing layer 500 is $Sb_2Te_3$.

The semiconductor structure further includes a first spacer 611, where the first spacer 611 is disposed on the substrate 100 and covers a side wall of the inducing layer 500 and a side wall of the gate dielectric layer 200.

A material of the first spacer 611 may be silicon oxide, silicon nitride, silicon oxynitride, and the like. In this embodiment, the material of the first spacer 611 is silicon oxide.

The projection of the inducing layer 500 on the substrate 100 and the projection of the gate dielectric layer 200 on the substrate 100 completely overlap. The top surface of the first spacer 611 is flush with the top surface of the inducing layer 500. The outer side wall of the first spacer 611 is flush with the outer side wall of the conductive plug 400. The projection of the first conductive layer 300 on the substrate 100 is within the projection of the gate dielectric layer 200 on the substrate 100.

It is worth mentioning that, the projection of the first spacer 611 on the substrate 100 falls within the projection of the conductive plug 400 on the substrate 100, and the outer side wall of the first spacer 611 is flush with the outer side wall of the conductive plug 400. In this case, a contact area between the conductive plug 400 and the inducing layer 500 may be changed by changing the thickness of the first spacer 611, i.e., by changing a contact area between the top surface of the first spacer 611 and the bottom surface of the conductive plug 400. The smaller the contact area between the conductive plug 400 and the inducing layer 500 is, the more centralized the breakdown position is.

The semiconductor structure further includes a second spacer 620, where the second spacer 620 is disposed on the substrate 100 and covers the outer side wall of the conductive plug 400 and the outer side wall of the first spacer 611. In this embodiment, the material of the second spacer 620 may be silicon nitride.

The semiconductor structure also includes a barrier layer 700 and a second conductive layer 800, where the barrier layer 700 is disposed on the first conductive layer 300, and the second conductive layer 800 is disposed on the barrier layer 700. The conductive plug 400 covers the side wall of the barrier layer 700 and the side wall of the second conductive layer 800. The projections of the first conductive layer 300, the barrier layer 700 and the second conductive layer 800 on the substrate 100 completely overlap.

A material of the first conductive layer 300 may be polysilicon or metal, where the metal may be one or more of W, Al, Cu, Ti, Ag, Au, Pt, and Ni.

In this embodiment, the material of the first conductive layer 300 is polysilicon.

The barrier layer 700 is provided between the first conductive layer 300 and the second conductive layer 800, to prevent ions in the second conductive layer 800 from diffusing into the first conductive layer 300 and prevent ions in the first conductive layer 300 from diffusing into the second conductive layer 800. The material of the barrier layer 700 may be titanium nitride, but is not limited thereto.

The barrier layer 700 may be formed by means of atomic layer deposition (ALD), such that a thickness of the barrier layer 700 may be guaranteed.

A material of the second conductive layer 800 may be metal, which may be one or more of W, Al, Cu, Ti, Ag, Au, Pt, and Ni.

Figure 12:
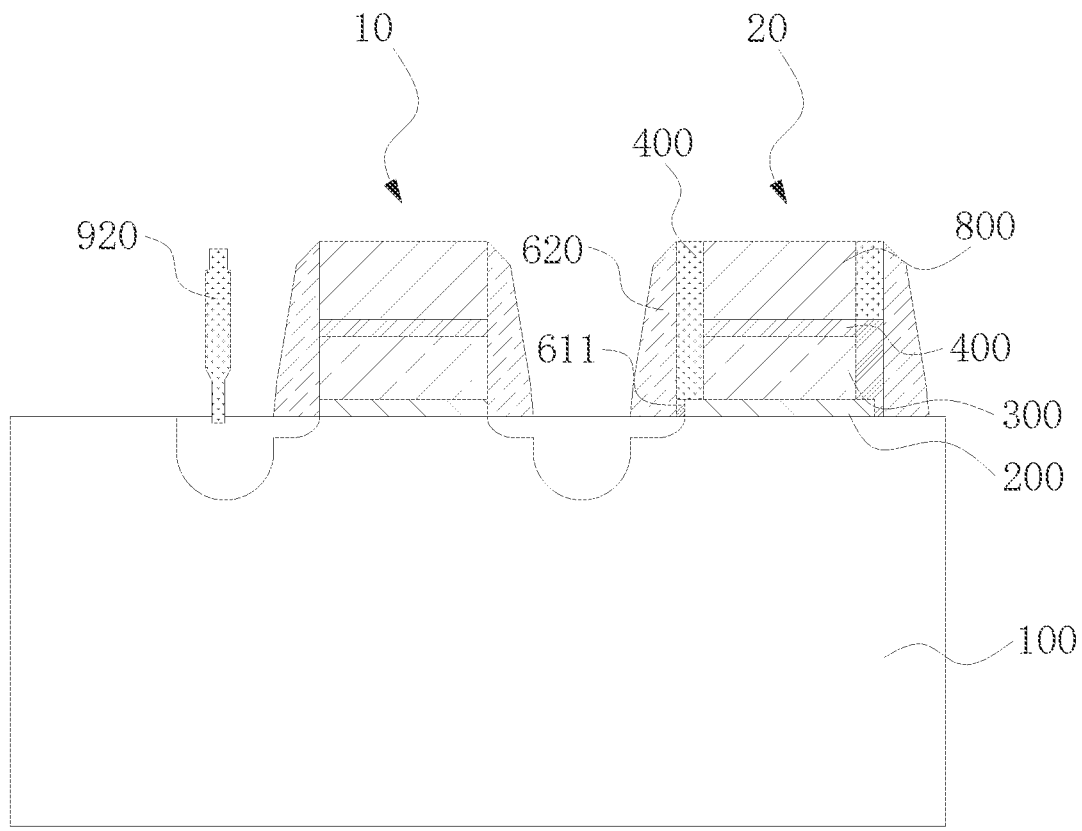
FIG. 12 illustrates a semiconductor structure according to another embodiment of the present disclosure.

As shown in FIG. 12, FIG. 12 illustrates a semiconductor structure according to another embodiment of the present disclosure. Similarities between another embodiment of the present disclosure and the above-described embodiment are not described any more, and the difference therebetween lies in that the inducing layer 500 is not included in the semiconductor structure of this embodiment, such that the bottom surface of the conductive plug 400 is in direct contact with the top surface of the gate dielectric layer 200.

In some embodiments, the semiconductor structure in the embodiment of the present disclosure includes a substrate 100, a gate dielectric layer 200, a first conductive layer 300, and a conductive plug 400. The gate dielectric layer 200 is disposed on the substrate 100, the first conductive layer 300 is arranged on the gate dielectric layer 200, and the conductive plug 400 is disposed on the gate dielectric layer 200 and covers a side wall of the first conductive layer 300. A projection of the conductive plug 400 on the substrate 100 and a projection of the gate dielectric layer 200 on the substrate 100 at least partially overlap, such that the conductive plug 400 can guide the current to break down the region of the gate dielectric layer 200 corresponding to the conductive plug 400.

In this way, the breakdown current can break down the region of the gate dielectric layer 200 corresponding to the conductive plug 400 by means of the conductive plug 400. That is, the breakdown position is adjusted by controlling the overlapping position between the conductive plug 400 and the gate dielectric layer 200, to achieve an effect of centralized breakdown position, thereby ensuring consistency in programming.

It is to be understood that, the method for fabricating the semiconductor structure in this embodiment is substantially the same as that in the above embodiment except that: as shown in FIG. 2, the gate dielectric layer 200, the first conductive layer 300, the barrier layer 700 and the second conductive layer 800 are sequentially formed on the substrate 100 from bottom to top, and the inducing layer 500 is not included. Next, the processes as shown in FIG. 3 to FIG. 11 may be performed in sequence, which are not described herein again.

To sum up, advantages and beneficial effects of the semiconductor structure and the method for fabricating the same in the embodiments of the present disclosure at least are as below.

In the semiconductor structure in the embodiments of the present disclosure, by providing the conductive plug 400, a breakdown current can break down a region of the gate dielectric layer 200 corresponding to the conductive plug 400 by means of the conductive plug 400. That is, a breakdown position is adjusted by controlling an overlapping position between the conductive plug 400 and the gate dielectric layer 200, to achieve an effect of centralized breakdown position, thereby ensuring consistency in programming.

Under the combined action of the conductive plug 400 and the inducing layer 500, the breakdown position is more fixed, and the breakdown voltage is smaller, which not only achieves the effect of centralized breakdown position, but also can save the energy consumption.

In the descriptions of this specification, reference to the terms "one embodiment," "some embodiments," "an embodiment," means that a feature, structure, material, or characteristic described in connection with the embodiment or example is included in at least one embodiment or example of the present disclosure. The schematic representation of the above terms throughout this specification is not necessarily referring to the same embodiment or example. Furthermore, the features, structures, materials, or characteristics set forth may be combined in any suitable manner in any one or more embodiments or examples.

The above embodiments are merely some embodiments of the present disclosure, and are not intended to limit the embodiments of the present disclosure. To those skilled in the art, the embodiments of the present disclosure may have various alterations and variations. All modifications, equivalent substitutions and improvements made within the spirit and principle of the embodiments of the present disclosure shall fall within the protection scope of the embodiments of the present disclosure.

What is claimed is:

1. A semiconductor structure, comprising:
a substrate;
a gate dielectric layer provided on the substrate;
a first conductive layer provided on the gate dielectric layer;
a conductive plug provided on the gate dielectric layer and covering a side wall of the first conductive layer, a projection of the conductive plug on the substrate and a projection of the gate dielectric layer on the substrate at least partially overlapping; and
an inducing layer, wherein the inducing layer is provided between the gate dielectric layer and the first conductive layer, a top surface of the inducing layer is in contact with the conductive plug, and a bottom surface of the inducing layer is in contact with the gate dielectric layer.

2. The semiconductor structure according to claim 1, wherein a projection of the first conductive layer on the substrate is within the projection of the gate dielectric layer on the substrate.

3. The semiconductor structure according to claim 1, further comprising a first spacer, wherein the first spacer is provided on the substrate, and covers a side wall of the inducing layer and a side wall of the gate dielectric layer.

4. The semiconductor structure according to claim 3, wherein a top surface of the first spacer is flush with a top surface of the inducing layer; and
an outer side wall of the first spacer is flush with an outer side wall of the conductive plug.

5. The semiconductor structure according to claim 3, further comprising a second spacer, wherein the second spacer is provided on the substrate, and covers an outer side wall of the conductive plug and an outer side wall of the first spacer.

6. The semiconductor structure according to claim 1, wherein the inducing layer comprises a phase change material.

7. The semiconductor structure according to claim 6, wherein the phase change material comprises one or any combination of antimony telluride, germanium antimony tellurium, scandium antimony tellurium, and chromium antimony tellurium.

8. The semiconductor structure according to claim 1, further comprising a barrier layer and a second conductive layer, wherein the barrier layer is provided on the first conductive layer, and the second conductive layer is provided on the barrier layer.

9. The semiconductor structure according to claim 8, wherein the conductive plug covers a side wall of the barrier layer and a side wall of the second conductive layer.

10. A method for fabricating a semiconductor structure, comprising:
providing a substrate;
sequentially forming a gate dielectric layer, an inducing layer on the gate dielectric layer and a first conductive layer on the substrate from bottom to top; and
forming a conductive plug on a side wall of the first conductive layer, wherein a projection of the conductive plug on the substrate and a projection of the gate dielectric layer on the substrate at least partially overlap; wherein a top surface of the inducing layer is in contact with the conductive plug, a bottom surface of the inducing layer is in contact with the gate dielectric layer, and a projection of the inducing layer on the substrate and the projection of the gate dielectric layer on the substrate completely overlap.

11. The method for fabricating the semiconductor structure according to claim 10, wherein after sequentially forming the gate dielectric layer and the first conductive layer on the substrate from bottom to top, and before forming the conductive plug on the side wall of the first conductive layer, the method further comprises: sequentially forming a barrier layer and a second conductive layer on the first conductive layer from bottom to top.

12. The method for fabricating the semiconductor structure according to claim 11, wherein the forming the conductive plug on the side wall of the first conductive layer comprises:
forming a sacrificial wall on a side wall of the gate dielectric layer, a side wall of the inducing layer, a side wall of the first conductive layer, a side wall of the barrier layer and a side wall of the second conductive layer respectively, wherein the sacrificial wall is in contact with a top surface of the inducing layer;
forming a second spacer on an outer side wall of the sacrificial wall;
removing part of the sacrificial wall to form a gap between the second spacer and the first conductive layer, the barrier layer and the second conductive layer, a bottom of the gap exposing the inducing layer, wherein a remaining part of the sacrificial wall is used as a first spacer, and the first spacer is provided on the substrate and covers the side wall of the inducing layer and the side wall of the gate dielectric layer; and
filling a conductive material in the gap to form the conductive plug.

13. The method for fabricating the semiconductor structure according to claim 12, wherein the removing part of the sacrificial wall to form the gap between the second spacer and the first conductive layer, the barrier layer and the second conductive layer comprises:
removing part of the sacrificial wall by means of wet etching until a top surface of the sacrificial wall retained is flush with a bottom surface of the second conductive layer; and
removing part of the sacrificial wall retained by means of dry etching until the top surface of the remaining part of the sacrificial wall is flush with a top surface of the inducing layer.

14. The method for fabricating the semiconductor structure according to claim 11, wherein the conductive plug covers a side wall of the barrier layer and a side wall of the second conductive layer.

15. The method for fabricating the semiconductor structure according to claim 10, wherein the inducing layer comprises a phase change material.

16. The method for fabricating the semiconductor structure according to claim 15, wherein the phase change material comprises one or any combination of antimony telluride, germanium antimony tellurium, scandium antimony tellurium, and chromium antimony tellurium.

* * * * *